US007605046B2

United States Patent
Marwitz

(10) Patent No.: US 7,605,046 B2
(45) Date of Patent: Oct. 20, 2009

(54) ACTIVE MATRIX STRUCTURE FOR A DISPLAY DEVICE AND METHOD FOR ITS MANUFACTURE

(76) Inventor: Ludger Marwitz, Im Winkel 49, 46395 Bocholt (DE)

( * ) Notice: Subject to any disclaimer, the term of this patent is extended or adjusted under 35 U.S.C. 154(b) by 245 days.

(21) Appl. No.: 11/358,475

(22) Filed: Feb. 21, 2006

(65) Prior Publication Data
US 2007/0051953 A1 Mar. 8, 2007

(30) Foreign Application Priority Data
Feb. 21, 2005 (EP) ................... 05003689

(51) Int. Cl.
*H01L 21/331* (2006.01)
(52) U.S. Cl. .................. 438/309; 438/99; 438/151; 257/E29.183
(58) Field of Classification Search ............ 438/99, 438/309, 151; 257/E29.183
See application file for complete search history.

(56) References Cited

U.S. PATENT DOCUMENTS

| 4,918,504 | A | * | 4/1990 | Kato et al. ................ 257/59 |
| 5,082,793 | A | | 1/1992 | Li |
| 5,376,561 | A | * | 12/1994 | Vu et al. ................. 438/118 |
| 6,690,434 | B1 | * | 2/2004 | Yamazaki et al. ........... 349/42 |
| 7,030,412 | B1 | * | 4/2006 | Drzaic et al. ............. 257/59 |

FOREIGN PATENT DOCUMENTS

EP    0838846    4/1998

OTHER PUBLICATIONS

Kagan, C.R. et al.; "Thin-Film Transistors"; 2003; Marcel Dekker, Inc.; pp. 400-418.*
Ng, Kwok K.; "Complete Guide To Semiconductor Devices"; 2002; John Wiley & Sons, Inc.; p. 266-281 and p. 656-659.*
Muller, R.S., Kamins, T.I. et al.; "Device Electronics for Integrated Circuits"; 2003; John Wiley & Sons, Inc.; p. 278-379.*
Kagan, C. R. and Andry, P.; "Thin-Film Transistors"; 2003; Marcel Dekker, Inc.; p. 188.*

* cited by examiner

*Primary Examiner*—Walter L Lindsay, Jr.
*Assistant Examiner*—Vicki B Booker
(74) *Attorney, Agent, or Firm*—Baker Botts L.L.P.

(57) ABSTRACT

The invention relates to an active matrix structure and method for manufacturing the active matrix structure for a display device, wherein the structure includes: providing a matrix substrate with a number of row lines and a number of column lines, with each point of intersection between one of the row lines and one of the column lines being assigned a passage through the matrix substrate for generating a pixel, depositing a layer of p-silicon on the matrix substrate, for each pixel, creating an $n^+$-doped region in the p-silicon, which $n^+$-doped region is provided from the passage as far as a free surface of the p-silicon layer, and creating a $p^+$-doped region within the $n^+$-doped region such that a layer of the $n^+$-doped region remains, and applying a layer made of a matrix material which has particles of electronic ink contained therein, or an organic light-emitting diode layer on a free surface of the final structure resulting from step c).

12 Claims, 3 Drawing Sheets

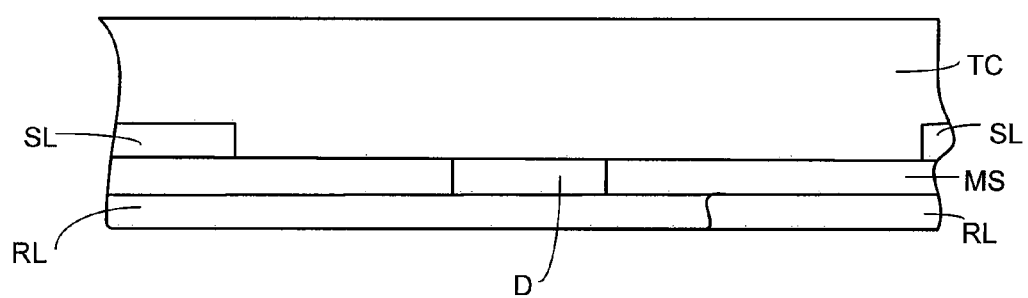
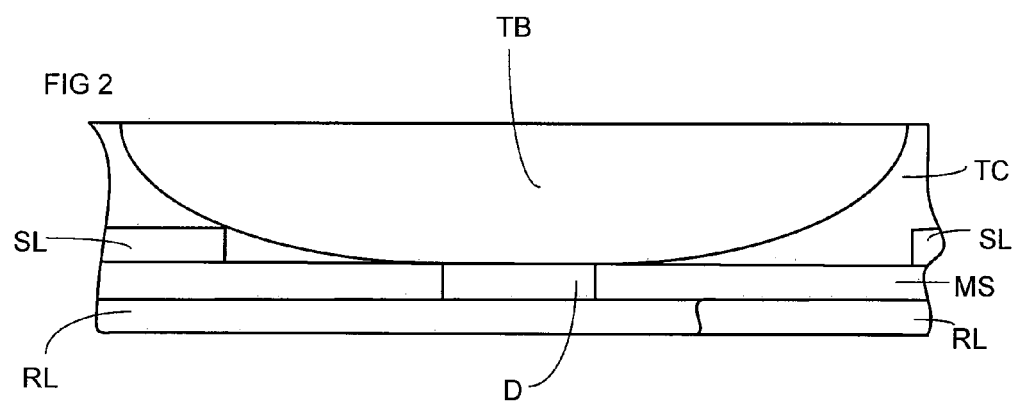

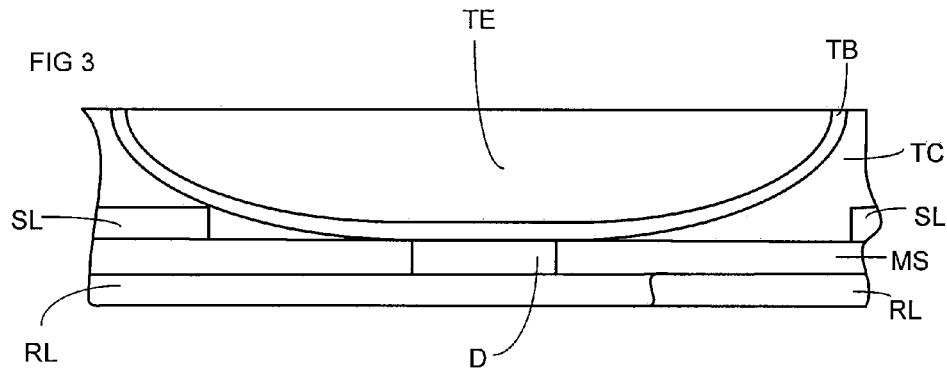
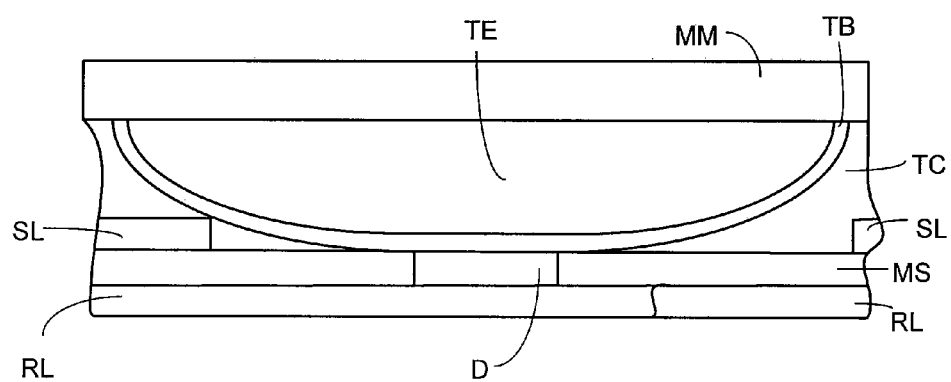

ACTIVE MATRIX STRUCTURE FOR A DISPLAY DEVICE AND METHOD FOR ITS MANUFACTURE

FIELD OF TECHNOLOGY

The disclosure relates to an active matrix structure for a display device and to a method for its manufacture.

BACKGROUND

In the manufacture of what are known as flat-panel displays, use is made of active matrix structures which are based on polarization effects of liquid crystals. In this context displays referred to as "active matrix LCDs" are known in which individual pixels are controlled using CMOS transistors.

A characteristic of known active matrix structures of this kind is that they are very complex with respect to the manufacturing method. Requirements for implementing a display device typically include a light source for providing lighting from the back, a diffuser, a rear polarizer, a matrix substrate having a number of row lines and a number of column lines, together with associated drivers, a liquid crystal layer, a color filter layer and a front polarizer.

SUMMARY

Proceeding from this starting point, the present disclosure specifies an active matrix structure for a display device as well as a method for its manufacture which is simplified compared with the prior art.

Under an exemplary embodiment, an active matrix structure and a method for manufacturing the active matrix structure is disclosed, comprising:

a) providing a matrix substrate having a number of row lines and a number of column lines, with each point of intersection between one of the row lines and one of the column lines being assigned a passage through the matrix substrate for generating a pixel, b) depositing a layer of p-silicon on the matrix substrate, c) for each pixel, creating an n+-doped region in the p-silicon, which n+-doped region is provided from the passage as far as a free surface of the p-silicon layer, and creating a p+-doped region within the n+-doped region such that a layer of the n+-doped region remains, and d) applying a layer made of a matrix material which has particles of electronic ink contained therein, or an organic light-emitting diode layer on a free surface of the final structure resulting from step c).

Starting with a matrix substrate, an active matrix structure can be provided under the exemplary embodiment using a relatively small number of subsequent steps. The particular simplicity of the method stems from the fact that, in contrast to the prior art, an opacity of the active matrix structure can be tolerated to a certain degree because the particles of electronic ink or the optical light-emitting diodes can represent a desired text or a desired image solely when light is incident from outside, or, as the case may be, do not have to have light passed through them.

The steps b) and c) can preferably be carried out by means of ion implantation and subsequent laser annealing. In step c) ions are implanted which enable an increased electron conduction, while in a subsequent sub-step suitable ions are implanted for an increased hole conduction. A laser annealing step is carried out in each case to achieve a homogenization both of the n+-doped regions and of the p+-doped region.

The final method step d) can provide that the layer of matrix material is laminated onto the free surface.

The result of the method is an active matrix structure which in particular can also be pliable, enabling flexible display devices to be implemented.

The resulting active matrix structure comprises a matrix substrate that has a number of row lines and a number of column lines, with each point of intersection between one of the row lines and one of the column lines being assigned a passage through the matrix substrate for generating a pixel, a layer of p-silicon on the matrix substrate, with there being provided for each pixel in the layer of p-silicon an n+-doped region which extends from the passage as far as an opposite surface of the p-silicon layer, and a p+-doped region being provided within each n+-doped region, and a layer of a matrix material which has particles of electronic ink contained therein, or an organic light-emitting diode layer on a free surface of the p-silicon layer.

This active matrix structure is obtained as the product of the above explained manufacturing method.

The method presented is suitable for particularly low-cost display devices. No resistors are required, with only very few and simple method steps having to be performed without the necessity for using photolithographic techniques.

BRIEF DESCRIPTION OF THE DRAWINGS

The various objects, advantages and novel features of the present disclosure will be more readily apprehended from the following Detailed Description when read in conjunction with the enclosed drawings, in which:

FIG. 1 illustrates a pixel area of an active matrix structure in a first method step under an exemplary embodiment;

FIG. 2 illustrates the pixel area from FIG. 1 in a second method step;

FIG. 3 illustrates the pixel area from FIG. 1 in a third method step;

FIG. 4 illustrates the pixel area from FIG. 1 in a final method step; and

DETAILED DESCRIPTION

Figure 5:
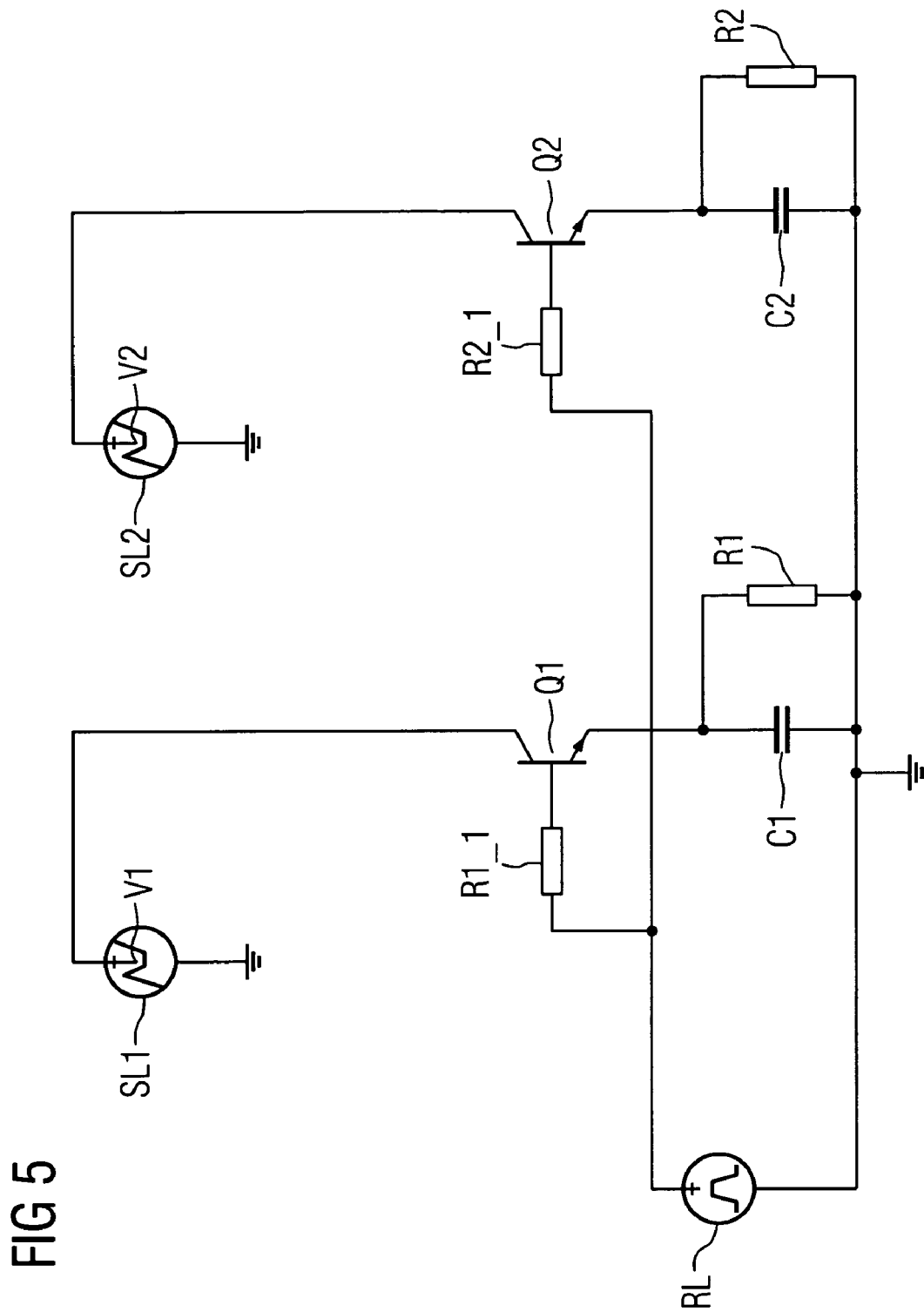
FIG. 5 illustrates an equivalent circuit diagram for two pixel areas of the active matrix structure.

The pixel area illustrated in FIG. 1 shows, as the starting point of the manufacturing method, a matrix substrate MS, made, for example, of "PET" (polyethylene terephthalate), which is preferably a flexible material. The uneven side lines indicate that FIGS. 1-4 merely show a single pixel cell of a matrix. A plurality of row lines RL are provided on an underside of the matrix substrate MS, wherein a part of the right side of this line RL is cut out to show that further lines RL are arranged spaced apart behind line RL in FIGS. 1 to 4 to form a matrix with column lines SL. Provided on a topside of the matrix substrate MS are column lines SL running perpendicular to the row lines RL. The column line SL on the left side is associated with the shown cell whereas the column line on the right side is associated to an adjacent cell. For the purpose of defining pixels, a passage D is provided in each case, and more specifically in the matrix substrate MS. The passage D is filled with a material such that a resistance of approx. 1' $\Omega$ to 10' $\Omega$ is obtained.

A layer of p-silicon TC is deposited on the matrix substrate MS, and more specifically up to a thickness of approx. several μm to approx. 0.1 mm. The column lines SL are thus located within the p-silicon layer TC.

As illustrated in FIG. 2, in another method step, ions are implanted in the p-silicon layer TC, with the ions being charged in such a way that an n+-doped region TB is formed which extends from the passage, then spreads to all sides of the passage until it has reached a free surface of the p-silicon layer TC. In order to dope/restructure the lattice, a laser annealing method step is performed, and more specifically for the n+-doped region TB. Laser annealing can be performed for example with the aid of an XeCl excimer laser operating in pulsed mode. At a wavelength of 308 mm and a pulse duration of approximately 35 ms, thin amorphous silicon layers, in the present case the p-silicon layer TC, are crystallized and doped without the underlying matrix substrate being heated up. The p-silicon remains in a melted state for about 20 to 250 ns, dependent on the laser energy flow, which is typically in the range from 150 to 350 mJ/cm2. Both n- and p-doping can be performed using films with a thickness of approximately 30 Å previously deposited in a plasma with doping material. The very thin deposited films are mixed with the underlying p-silicon, and more specifically during a process in which the silicon is melted and a new crystal structure grows. This process is triggered by the laser pulse.

In a third method step, which is illustrated in FIG. 3, a p+-doped region TE is formed within the n+-doped region TB, again by ion implantation and laser annealing. There remains a roughly dish-shaped layer for the n+-doped region TB, while an inner region of the n+-doped layer TB is p+-doped all the way through.

In a concluding method step illustrates in FIG. 4, a matrix material MM which has particles of electronic ink contained therein is laminated onto a free surface of the final structure resulting from the preceding method step. All in all there results a semiconductor structure which is comparable in terms of its electrical characteristics to a bipolar transistor. In the process, a remaining region of the p-silicon TC forms a collector in proximity to a column line SL. The n+-doped layer TB is the base, while the p+-doped region TE acts as the emitter and at the same time also as the pixel capacitance.

The matrix material MM can also be referred to as what is termed "electronic paper", with the result that all the layers of the active matrix structure for a display device exhibit a certain flexibility. In this way it is made possible for example to provide rollable active matrix structures.

Referring now to FIG. 5, it will be explained how a pixel is activated. FIG. 5 relates to a part of the active matrix structure having two pixel areas, both of which are assigned to the same row line RL but different column lines SL1, SL2.

A control pulse with a voltage V0 is applied to the row line RL, while the voltages V1 and V2 are provided at the two column lines SL1, SL2 respectively. This means that in FIG. 4 the voltage V0 is present at the row line RL and the voltage V1, for example, is present at the column line SL1. In terms of circuit components, each pixel comprises a bipolar transistor Q1 whose emitter is formed by the p+-doped region TE, whose base is formed by the n+-doped region TB and whose collector is formed by the p-silicon between the n+-doped region TB and the column line SL. The n+-doped, base-forming region TB is connected to the row line RL via a resistor R1 which originates from the passage D and the feeder line. The p+-doped silicon region TC adjoins the column line SP. The emitter, corresponding to the p+-doped region TE, forms the capacitor C1 by means of its depletion layer and the pixel capacitance, where the capacitor C1 is connected to ground. A resistor R1 connected in parallel to the capacitor C1 symbolizes leakage currents that are present. A bipolar transistor Q2, a resistor R2_1 to the row line RL, a capacitor C2, and a resistor R2 illustrate a second pixel. In the case of this second pixel a collector region is connected to a second column line SL2, while the remaining circuit components correspond to those of the first pixel.

A short voltage pulse lasting, for example, two As for the voltage V0 then causes the voltage V1 or V2 to be applied to a respective capacitor C1, C2. A charge present at the capacitor C1 or C2 causes the particles of electronic ink, which may be formed from two hemispheres, one white, the other black, are oriented as desired, thus making possible a pictorial representation of a desired text. The two hemispheres carry different electrical charges, so a charge voltage of the capacitors C1, C2 can determine their orientation within the matrix material. Alternatively, the charge of C1, C2 can be used for driving OLED pixels.

Despite the use of bipolar technology it can be assumed that the resulting active matrix structure is energy-efficient. This is because each transistor Q1, Q2 drives a load in the form of the capacitors C1, C2, which load is great compared with the input load of a digital circuit. Experimental investigations by the inventor have shown that a base current for pixels whose charge is changed is small, while the base current in the case of an unchanged pixel voltage is very low.

While the invention has been described with reference to one or more exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

The invention claimed is:

1. A method for forming an active matrix structure, comprising the steps of:
   a) providing a matrix substrate with a plurality of row lines and column lines and creating passages through the matrix substrate, each passage defining a center of a pixel area wherein each passage connects to a row line in between adjacent column lines;
   b) depositing a layer of p-silicon on the matrix substrate;
   c) creating an $n^+$-doped region for each pixel area in the p-silicon, wherein said $n^+$-doped region is provided from the passage as far as a free surface of said layer of p-silicon, and creating a $p^+$-doped region within said $n^+$-doped region such that a layer of said $n^+$-doped region remains and said $p^+$-doped region reaches a free surface of said $n^+$-doped region; and
   d) applying a layer made of a matrix material which has particles of electronic ink contained therein, or an organic light-emitting diode layer on free surfaces of said layer of p- silicon and said $n^+$-doped and said $p^+$-doped regions.

2. The method as claimed in claim 1, wherein said steps c) and d) are performed by means of ion implantation and subsequent laser annealing.

3. The method as claimed in claim 1, wherein said layer made of matrix material in said step d) is laminated onto said free surfaces.

4. A method for forming an active matrix structure, comprising the steps of:
   a) providing a substrate with at least one row line and at least one column line and creating a plurality of passages through the substrate to at least one row line each passage being located in between two adjacent column lines wherein each passage defines a center of a pixel area;

b) depositing a layer of p-silicon on the substrate;

c) creating an $n^+$-doped region for each pixel area in the layer of p-silicon, wherein said $n^+$-doped region extends from the passage to a surface of said layer of p-silicon, and creating a $p^+$-doped region within said $n^+$-doped region such that a layer of said $n^+$-doped region remains and said $p^+$-doped region reaches the surface of said $n^+$-doped region; and d) depositing a layer made of a material which has particles of electronic ink contained therein, or an organic light-emitting diode layer on said surface of said layer of p-silicon and said $n^+$-doped and said $p^+$-doped regions.

5. The method as claimed in claim 4, wherein said steps c) and d) are performed by means of ion implantation and subsequent laser annealing.

6. The method as claimed in claim 4, wherein the step of depositing a layer made of a material in said step d) comprises laminating said layer onto said surface.

7. The method as claimed in claim 1, wherein said passage is filled with a material such that a resistance between 1 kΩ and 10 kΩ is obtained.

8. The method as claimed in claim 4, wherein said passage is filled with a material such that a resistance between 1 kΩ and 10 kΩ is obtained.

9. A method for forming an active matrix structure having a plurality of pixel areas, comprising the steps of:

a) providing a matrix substrate with a plurality of row lines and column lines and creating passages through the matrix substrate above each row line in between adjacent column lines;

b) depositing a layer of p-silicon on the matrix substrate;

c) creating an $n^+$-doped region for each pixel area in the p-silicon, wherein said $n^+$-doped region is provided from the passage as far as a free surface of said layer of p-silicon, and creating a $p^+$-doped region within said $n^+$-doped region such that a layer of said $n^+$-doped region remains and said $p^+$-doped region reaches a free surface of said $n^+$-doped region; and d) applying a layer made of a matrix material which has particles of electronic ink contained therein, or an organic light-emitting diode layer on free surfaces of said layer of p-silicon and said $n^+$-doped and said $p^+$-doped regions.

10. The method as claimed in claim 9, wherein said steps c) and d) are performed by means of ion implantation and subsequent laser annealing.

11. The method as claimed in claim 9, wherein said layer made of matrix material in said step d) is laminated onto said free surfaces.

12. The method as claimed in claim 9, wherein said passage is filled with a material such that a resistance between 1 kΩ and 10 kΩ is obtained.

* * * * *